United States Patent [19]
Owens et al.

[11] Patent Number: 5,621,616
[45] Date of Patent: Apr. 15, 1997

[54] HIGH DENSITY CMOS INTEGRATED CIRCUIT WITH HEAT TRANSFER STRUCTURE FOR IMPROVED COOLING

[75] Inventors: Alexander H. Owens, Los Gatos; Gobi Padmanabhan, Sunnyvale, both of Calif.

[73] Assignee: LSI Logic Corporation, Milpitas, Calif.

[21] Appl. No.: 536,002

[22] Filed: Sep. 29, 1995

[51] Int. Cl.$^6$ .................................................. H05K 7/20
[52] U.S. Cl. ..................... 361/704; 257/707; 257/713; 257/774; 257/698; 361/714; 361/718; 361/722
[58] Field of Search ......................... 257/698, 706–707, 257/712–713, 762, 765, 771, 774, 777, 779; 361/704, 707, 714–722

[56] References Cited

U.S. PATENT DOCUMENTS

| | | | |
|---|---|---|---|
| 4,764,804 | 8/1988 | Sahara et al. | 257/713 |
| 5,406,120 | 4/1995 | Jones | 361/714 |

OTHER PUBLICATIONS

Balderes et al "Heat Dissipation From IC Chips Through Module Package" IBM Tech Disc. Bulletin, vol. 19, No. 11, Apr. 1977, pp. 4165–4166.

Primary Examiner—Gregory D. Thompson
Attorney, Agent, or Firm—Poms, Smith, Lande & Rose

[57] ABSTRACT

A semiconductor integrated circuit includes a semiconductor circuit chip housed in a package. The package provides for electrical interface of the integrated circuit chip with external circuitry, and also provides environmental protection for the circuit chip. The circuit chip includes a circuit portion which liberates heat into the semiconductor substrate of the chip during operation of the integrated circuit. The integrated circuit chip also includes a layer of insulative material which overlies the semiconductor substrate. A thermally conductive plug member penetrates through the layer of insulative material and extends into a hole formed in the semiconductor substrate. This plug member is in conductive heat transfer relation with the material of the semiconductor substrate, and connects thermally with high-conductivity heat transfer structure conducting heat from the substrate to the package for liberation to the ambient.

20 Claims, 3 Drawing Sheets

HIGH DENSITY CMOS INTEGRATED CIRCUIT WITH HEAT TRANSFER STRUCTURE FOR IMPROVED COOLING

BACKGROUND OF THE INVENTION

1. Field of the Invention

The present invention is in the field of integrated circuits. More particularly, the present invention relates to high density CMOS technology integrated circuits of the very large scale integrated circuit (VLSI) type, and of the ultra large scale integrated circuit (ULSI) type, which includes structure of highly thermally conductive material so positioned and arranged as to cooperate with the remainder of the integrated circuit structure, and also with a package of the integrated circuit, so as to conduct heat rapidly out of high heat generation areas of the integrated circuit, and directly to the package for dissipation into the ambient.

2. Related Technology

Historically, semiconductor processing and fabrication has changed from the NMOS technology used in the 1970's and 1980's, to CMOS technology used today. The driver for this technology change was power consumption (and the related heat dissipation) within the integrated circuit chips. Integrated circuits using CMOS technology have the advantage of similar electrical performance to the NMOS circuits, but at a lower power consumption and lower heat dissipation. Because of the lower heat dissipation, a less expensive package could be used with CMOS integrated circuits, which partially offset the initially higher processing costs for the fabrication of integrated circuits using the CMOS technology. The CMOS technology integrated circuits also have an advantage in improved reliability resulting from a lower operating temperature for the chips and their packages.

However, with the development of VLSI integrated circuits, it became apparent that the problem of marginal or inadequate heat dissipation and excessive operating temperatures had only been delayed, and not avoided entirely, by the change to CMOS technology. That is, the recent developments in VLSI CMOS integrated circuits of the high-density type have again brought forth serious problems with excessive operating temperatures and inadequate cooling. These problems go beyond the scope of cooling which can be provided by the use of mere conventional passive heat sinks attached to the integrated circuit package. Even in the usual use environment for such packaged integrated circuits in which a chassis cooling fan is used, the heat dissipation from some integrated circuits is inadequate, and excessively high and life-shortening temperatures are experienced.

One recent solution of a stop-gap nature has even involved mounting a small dedicated cooling fan directly to an integrated circuit chip mounting package. Another solution also of a stop-gap nature is to reduce the operating voltage of the integrated circuit chip from the traditional 5 volts to 3.3 volts, or even to 2.5 volts. However, the use of a dedicated chip-cooling fan places the life of an expensive integrated circuit at risk should the dedicated fan fail. The voltage-reduction expedients compromise the ability to easily interface the integrated circuit chip with other circuits designed to operate at the higher and traditional 5 volt level. At the ULSI levels of chip size and circuit density, cooling of integrated circuit chips has been recognized as a serious problem for which no adequate solution heretofore existed. The conventional cooling expedients of using special liquid-tight heat conductive packages, some of which provided spring loaded cooling fingers extending into contact with the integrated circuit chips themselves; and of providing for liquid cooling of the integrated circuits, such as is used in some large main-frame and super computers is not considered to be economically feasible for the lower cost and smaller systems in which many ULSI chips will be used.

In CMOS integrated circuits a significant portion of the dissipated heat is generated as the output drivers. Thus, these output driver circuits represent a particularly large part of the total heat generation within the integrated circuit chip. This heat generally spreads thorough and affects the entire chip. Moreover, the heat generated within a chip must be removed efficiently because virtually all failure mechanisms are enhanced by increased operating temperatures. Electromigration and oxide breakdown effects all worsen with increased temperature. Further, leakage currents increase in reverse-biased junctions and in turned-off MOS transistors with increased temperatures. At higher temperatures, corrosion mechanisms accelerate, and greater differential thermal expansion stresses are generated at material interfaces, such as at solder and wire-bond joints, as well as interfaces between semiconductor materials and metallic structures such as conductors of the integrated circuit.

With an integrated circuit chip in its package, radiation offers too small a contribution to the heat dissipation required to be considered a significant factor in cooling the integrated circuit. Conduction of heat within the chip from the areas of heat generation, and from the chip to the package for liberation into the ambient is the only effective mechanism for cooling the packaged integrated circuit chip. As mentioned above, cooling expedients, such as chassis fans and package-mounted fans may be used to liberate heat from the package to the ambient. The necessity for increased power (heat) dissipation from an integrated circuit chip increases with increased integration density, die size, and circuit speed. The ambient temperature is usually room temperature. Consequently, as the power dissipation from a chip increases, conductive heat transfer rates within the chip, from the chip to the package, within the package, and from the package to the ambient, must be addressed in order to maintain the temperatures within the chip at acceptable levels.

The following table provides an indication of the heat transfer conductivities of various materials used in the construction of integrated circuits and their packages.

| Material | Thermal conductivity (W/cm-°K.) |
| --- | --- |
| Silver | 4.3 |
| Copper | 4.0 |
| Aluminum | 2.3 |
| Tungsten | 1.7 |
| Molybdenum | 1.4 |
| Silicon | 1.5 |
| Germanium | 0.7 |
| Gallium arsenide | 0.5 |
| Silicone carbide | 2.2 |
| Alumina | 0.3 |
| Silicon dioxide | 0.01 |

As can be seen from the above table, there is a considerable difference in the heat transfer coefficients of these various materials. These differing conductive heat transfer rates should be kept in mind as the following description of a preferred embodiment of the invention is described. A similar difference among the materials applies with respect to the thermal coefficient of expansion of these various materials.

SUMMARY OF THE INVENTION

In view of the recognized deficiencies of the conventional technology, a primary object for this invention is to avoid one or more of these deficiencies.

Another object for this invention is to provide a high-density CMOS integrated circuit with heat transfer structure for dissipating heat from within the integrated circuit and improving cooling of the integrated circuit.

Still another object for the present invention is to provide such an integrated circuit with a package providing with heat transfer structure interfacing with that heat transfer structure of the integrated circuit for receiving heat directly from the integrated circuit.

Accordingly, according to one aspect, the present invention provides an integrated circuit having an integrated circuit chip housed within a package, the package providing for electrical interface of the integrated circuit chip with external electrical circuitry and also providing environmental protection for the integrated circuit chip, the integrated circuit chip having a semiconductor substrate; an electrical circuit portion of the integrated circuit formed on the semiconductor substrate; a frame-like portion of a metallization layer overlying the semiconductor substrate and circumscribing the electrical circuit portion; and means forming a high-conductivity heat transfer pathway from the frame-like portion to the package.

Additional objects and advantages of the present invention will be apparent from a reading of the following description of a particularly preferred embodiment of the invention, taken in conjunction with the appended drawing Figures, in which the same reference numeral is used to designate the same feature, or features which are analogous in structure or function.

DETAILED DESCRIPTION OF A PREFERRED EXEMPLARY EMBODIMENT OF THE INVENTION

Figure 1:
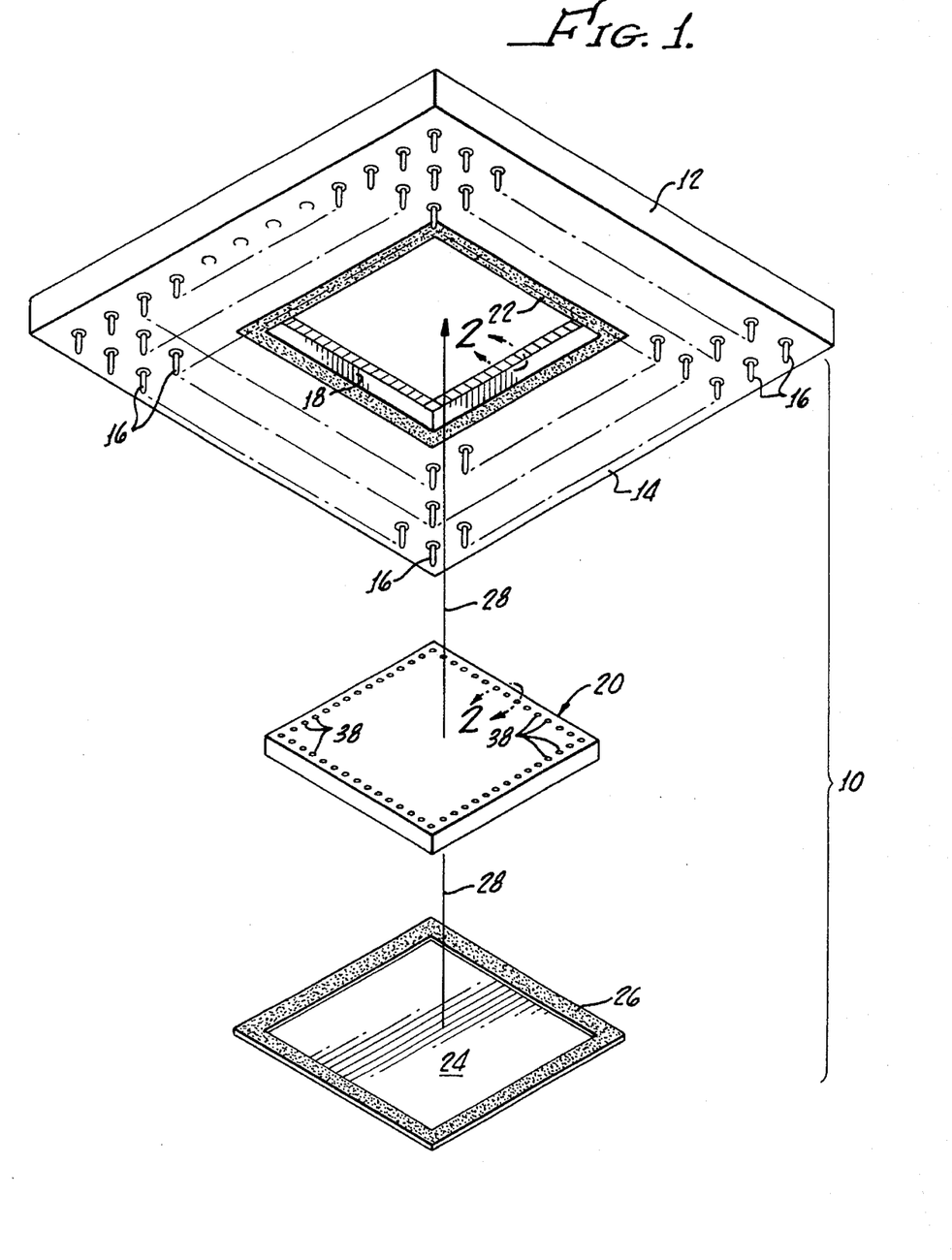
FIG. 1 depicts a packaged integrated circuit seen looking under the connector pin side of the package.

FIG. 1 shows a packaged integrated circuit 10 embodying the present invention. The packaged integrated circuit 10 includes a package 12 of generally flat rectangular configuration, having a generally flat surface 14 from which depends a multitude of electrical contact pins 16. Those ordinarily skilled in the pertinent arts will recognize that the package 12 provides for electrical interface and environmental protection for an integrated circuit chip or die 20 (introduced below), which is housed within the package 12. Also, on the opposite face of the package 12 (not visible in the drawing Figures) this package defines a flat upper surface. Much of the heat dissipated from the package 12 to the ambient will be liberated at this upper surface by conduction to the ambient air and with resulting formation of convection air flow currents. As is conventional, a heat sink may be attached to this upper surface to take better advantage of the cooling air flow provided by a conventional chassis cooling fan. Alternatively, a dedicated chip package cooling fan may be attached to the package 12 at this upper surface.

Centrally of the surface 14, the package 12 defines a rectangular recess 18 into which an integrated circuit chip or die 20 is received. The integrated circuit chip 20 is electrically and physically interfaced with the package 12, as will be further explained. The physical interface of the chip 20 with the package 12 provides for transfer to the package 12 of heat generated during operation of the chip 20 as will also be explained further. Package 12 conventionally dissipates this transferred heat to the ambient. Circumscribing the opening of recess 18 on the surface 14, the package 12 includes a sealing area 22. A plate-like closure member portion 24 of the package 12 similarly defines a sealing area 26 circumscribing this closure member and matching the shape of the sealing area 22. The closure member 24 is sealingly attached permanently at conjoined areas 22 and 26 to the remainder of package 12 (as is depicted by arrow 28 in FIG. 1) so that the integrated circuit chip is environmentally protected. An epoxy or solder, for example, may be used to sealingly join the closure member 24 to the remainder of package 12.

Figure 2:
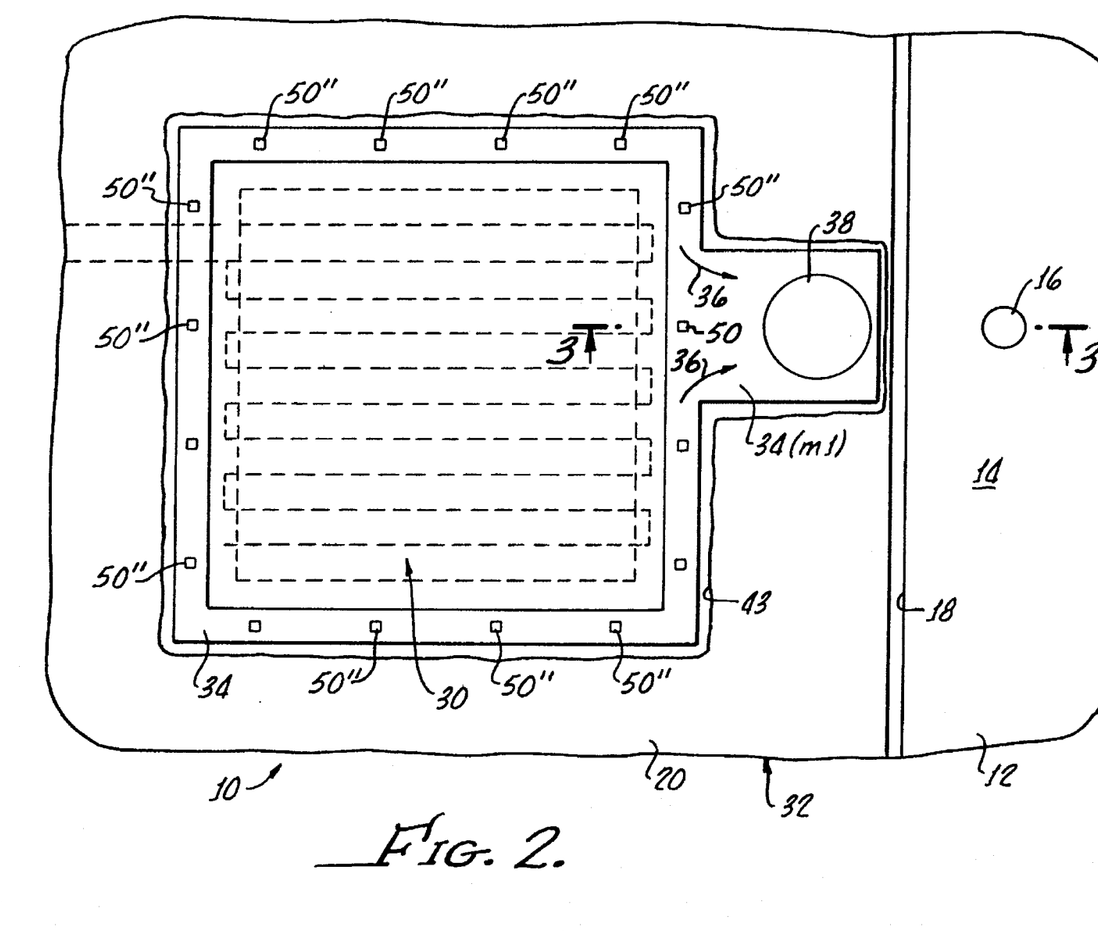
FIG. 2 provides a much enlarged fragmentary plan view taken at the encircled portion of FIG. 1, and fragmentarily showing the integrated circuit chip itself as though one were looking downwardly on this portion of the integrated circuit chip.

FIG. 2 provides a much enlarged fragmentary plan view generally taken at the encircled area of FIG. 1. In the view of FIG. 2, the direction of view is from the opposite side of the integrated circuit chip 20 as is seen in FIG. 1. The features seen in FIG. 2 confront the package 12 as seen in FIG. 1. As is seen in FIG. 2, the integrated circuit chip 20 includes a circuit portion (which is generally indicate with the numeral 30), which is a particularly power-consuming and heat-liberating portion of the circuitry formed on the chip 20. The semiconductor integrated circuit chip 20 is formed by and on a substrate 32 of semiconductor material. Accordingly, the circuit portion 30 is represented by a particular area of the active face of the substrate 32. By way of example only, the circuit portion 30 may be an output driver, for providing signals delivered to a particular one of the electrical contact pins 16. The integrated circuit chip 20 may include several such output driver portions 30. This output driver circuit portion 30 dissipates considerable heat because of its considerable power consumption. Accordingly, the area of substrate 32 within the area of circuit portion 30 would be subject to a considerable heat input, and represents a source of heat for the surrounding circuits outside of circuit portion 30. That is, heat would ordinarily be transferred from the circuit portion 30 to surrounding portions of the integrated circuit chip 20 by conduction within the semiconductor material of the substrate 32, and by conduction within the other layers of material on substrate 32 which form the various circuit features of the integrated circuit chip 20.

Figure 3:
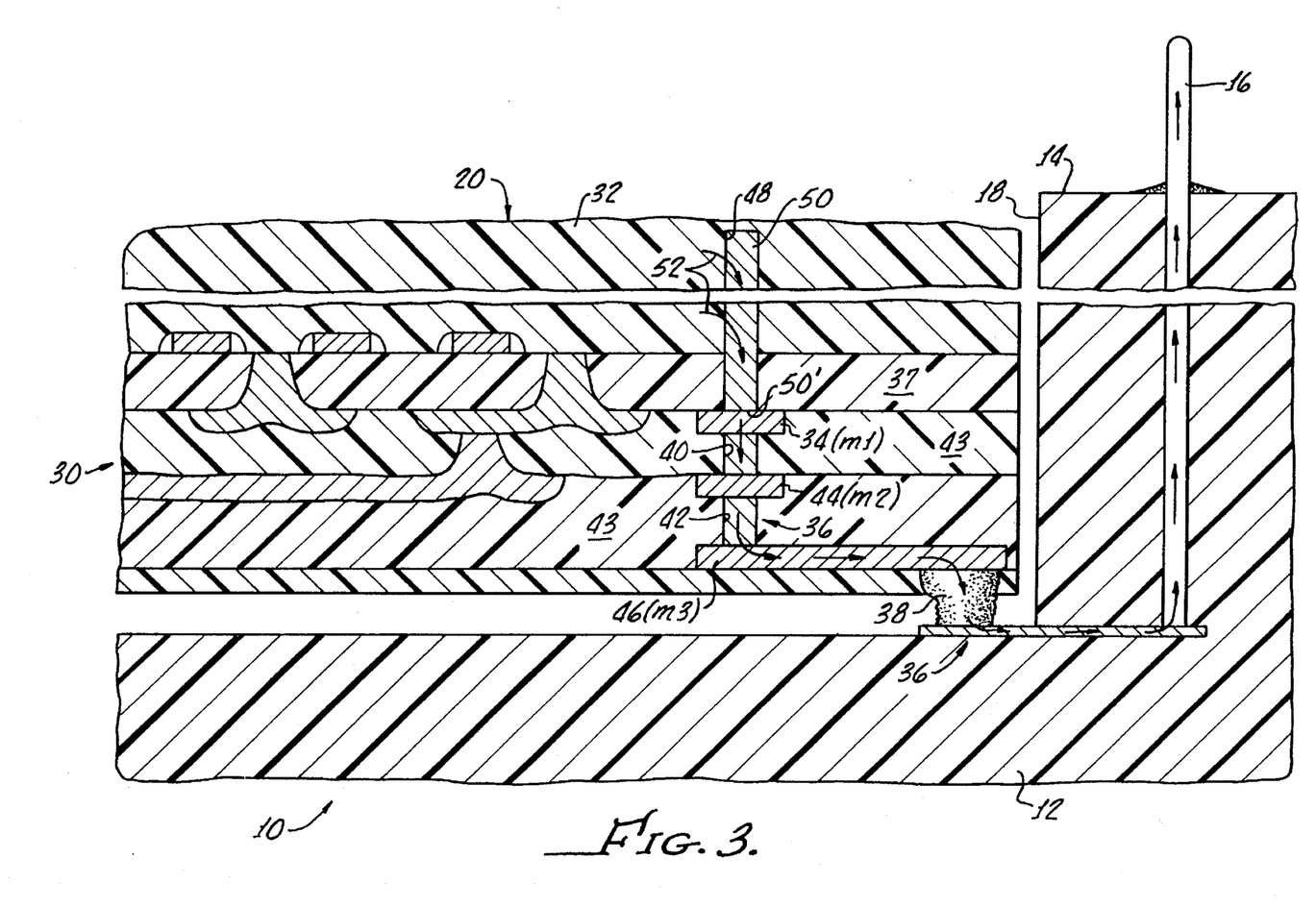
FIG. 3 provides a further much enlarged cross sectional elevation view taken generally at the line 3—3 of FIG. 2.

However, circumscribing the circuit 30 in plan view is a frame-like cooling feature 34. As is seen in FIG. 3, the cooling feature 34 may be fabricated from the first metallization layer provided during the fabrication of the integrated circuit chip 20. The successively applied metallization layers of the integrated circuit chip 20 are indicated on FIG. 2 with the character "m", with a subscript 1-3, indicating the sequential order of the application of these metallization layers. Those ordinarily skilled in the pertinent arts will recognize that metallization layer $m_1$ will elsewhere define other circuit features of the integrated circuit chip 20. Also, the integrated circuit chip 20 may include fewer or more than three layers of metallization. Integrated circuit chip 20 has three layers of metallization $m_1$ through $m_3$, simply as an example of one preferred embodiment of the invention. The metallization layer $m_1$ may define an electrical conductor interconnecting with the circuit 30, for example, and the cooling frame 34 may itself define a part of this electrical conductor for the circuit 30. In this way it is seen that the cooling frame feature 34, and the metallization layer which forms this cooling frame feature serves a dual function. On the one hand, this metallization layer forms conductors and other electrical features of the integrated circuit chip 20. On the other hand, this same metallization forms a cooling feature of high conductivity, as is further explained.

The cooling feature 34 circumscribes the circuit area 30 so that heat may transfer from the circuit 30 within this area via the material of the semiconductor substrate 32 and to this feature 34. As is seen also in FIG. 3, and as will be further explained, the cooling feature 34 has a high conductivity heat transfer relationship via a high-conduction pathway (generally indicated with the numeral 36) with a solder bump 38 carried by the integrated circuit chip 20. The high conduction heat transfer pathway 36 provided from the cooling feature 34 to the solder bump 38 involves electrically and thermally conductive vias 40 and 42 which are electrically and thermally connected to one another by intervening ones 44 (metallization $m_2$) and 46 (metallization $m_3$) of the successive metallization layers making up the interconnections of the circuit 30. The vias 40 and 42 may be formed of electrically and thermally conductive aluminum, silver, tungsten, or other appropriate material filling corresponding holes formed in insulative layers 43. The insulative layers 43 allow electrical conductors formed by portions of the metallization layers $M_2$ and $m_3$ to be insulated from one another. Those ordinarily skilled in the pertinent arts will know that electrically conductive materials are generally also good thermal conductors so that the material choice for the vias 40 and 42 can be based on electrical considerations alone. What ever the selected material for the vias 40 and 42, the heat transfer conductivity will be sufficient to define a high conductivity pathway to the solder bump 38. The uppermost metallization layer 46 ($m_3$) extends to and carries the solder bump 38. Those ordinarily skilled in the pertinent arts will recognize that the electrical path defined by metallizations $m_1$ through $m_3$ and vias 40, 42, also forms the thermal pathway 36 providing a high conductivity heat transfer path from the cooling frame 32 to the solder bump 38. For example, recalling the heat transfer coefficients set out in the table above, if the substrate material 32 is silicon and the metallization $m_1$ is formed of aluminum, then the heat transfer rates of these materials will be seen to be not markedly different. However, when it is recalled that many of the overlying circuit features and layers are formed of materials such as alumina with a heat transfer coefficient of only 0.3, and of silicon dioxide, for example, with a heat transfer coefficient of only 0.01, it is seen that a significant high-resistance insulating layer (or layers) is interposed between the metallization $m_1$ and the silicon substrate material 32 in most areas. This insulative layer (or layers) between the substrate 32 and the first metallization layer $m_1$ is generally referenced in FIG. 3 with the arrowed numeral 37.

As an initial consideration, because of the high rate of heat transfer provided by the pathway 36 to the bump 38, heat from the output driver circuit 30 is delivered to the solder bump and to the package 12. The solder bump 38 electrically connects with a respective one of the contact pins 16 by means of electrical conductors (not seen in the drawing Figures) carried in the package 12. This electrical connection between solder bump 38 and a respective contact pin 16 also provides an additional extension of the high conductivity heat transfer path 36 extending from the circuit 30. The cooling frame feature absorbs heat from the circuit portion 30 simply because of close proximity and surrounding relationship. The first metallization layer $m_1$ has intimate contact with the insulation layer 37, which receives heat from the circuit features of circuit portion 30. However, the insulation layers 37 represent a high resistance element in this heat transfer circuit. As is the case with conventional integrated circuits, heat from the circuit elements in circuit portion 30 could transfer away from the portion 30 within the substrate material 32 much more readily than through the insulative layers 37 were it not for additional features of the present invention to be described below. In the conventional integrated circuits, this heat transfer within the substrate material results in circuit elements which themselves do not liberate much heat still being exposed to high temperatures because of heat transfer from other high-power heat-liberating circuit elements. The integrated circuit chip 20 has a considerably different heat transfer structure, as will be seen.

FIG. 3 shows that in order to further develop a highly conductive heat transfer path between the metallization $m_1$ and the substrate 32, during manufacture of the integrated circuit chip 20 and before formation of the first metallization layer $m_1$, a hole 48 is etched through any material layers overlying the substrate 32 and which will underlie the metallization $m_1$, and into the substrate 32. In transverse cross section, this hole 48 may be round or square, or may be elongate parallel to the upper surface of the substrate 32 to have a trench-like cross sectional shape, as will be further explained. By means of chemical vapor deposition, this hole 48 is filled with a metal plug 50. In the case of a trench-like hole 48, it will be understood that the plug 50 would be plate-like. Preferably, the metal plug 50 is formed of tungsten metal, although other materials having a high heat transfer coefficient may be used. For example, silver with a heat transfer coefficient of 4.3 might be used to form the plug 50. When the first metallization $m_1$ is subsequently formed, an upper end surface 50' of the plug 50 is contacted by this metallization $m_1$.

Most preferably, the hole 48, plug 50, and vias 40, 42 are all stacked one atop the other, or aligned with one another so that the heat transfer pathway 36 has the shortest and most direct path practicable between the plug 50 and the solder bump 38. This short and direct pathway 36 is most desirable from a heat transfer viewpoint. However, a more circuitous pathway 36 will still provide a considerably improved cooling of the integrated circuit chip 20 and of circuit portion 30 compared to the conventional technology. This is the case because of the penetration of the intervening insulating layers of low thermal conductivity by the plug 50. Consequently, as is illustrated in FIG. 3 with the branched arrow 52, a high conductivity heat transfer path is formed from the substrate 32 in the area of circuit 30 along the plug 50, through the intervening insulative layers and into metallization layer $m_1$ (cooling frame 34), through the via 40 to metallization layer 44 ($m_2$), along via 42 to metallization layer 46 ($m_3$), and to the solder bump 38. The arrow 52 is branched at its lower end in the substrate 34 because the plug 50 acts like a tap root pulling in heat from the surrounding semiconductor material of substrate 32.

The plug 50 may have a variety of shapes, as mentioned above. The optimum shape for the plug 50 will depend on the comparative heat transfer coefficients for the material of substrate 32 and of plug 50, as well as the thickness of the intervening insulative layers. It will be understood that a round or square hole 48 and plug 50 may be considered similarly to a pin-fin for conductive heat transfer purposes. A trench-like hole 48 and plate-like plug 50 may be considered similarly to a plate-fin for conductive heat transfer purposes. Preferably, the plug 50 has a length to diameter ratio of about 10 to one, or more. The diameter of the hole 48 and resulting plug 50 may be about 0.5 micron, for example. Plugs 50 having a length to diameter ratio of about 10:1 will provide significant penetration of the plug 50 into the substrate 32 and the collection of considerable heat from this substrate into the plug 50 and to heat transfer pathway 36. Alternatively, the hole 48 and plug 50 may have a greater length to diameter ration, perhaps as much as 40:1.

Still more preferably, the cooling frame 34 has heat transfer connection with a plurality of spaced apart heat transfer plugs 50", which are similar to or substantially the same as plug 50. This plurality of heat transfer plugs are indicated in FIG. 2 with dashed lines according to the position of the plugs 50" beneath the metallization layer $m_1$. This plurality of heat transfer plugs 50" surrounds the circuit 30 so that the heat generated within this circuit portion 30 during operation is quickly collected by the plugs 50" and cooling frame 34. This heat is then conducted to the package 12 via the solder bump 38. As a result, the circuit portion 30 operates at a significantly lower temperature than would be the case were the heat transfer conductivity of the substrate and other circuit features alone to be relied upon to conduct heat to the package 12. Further, because the circuit 30 within which a considerable quantity of heat is generated is effectively surrounded by the high conductivity heat transfer "fence" created by the spaced apart plurality of plugs 50" sunk into the substrate 32, other surrounding circuit features of the chip 20 outside of this "fence" are saved from being exposed to high temperatures because heat flow outwardly into the substrate 32 from the circuit portion 30 is intercepted at least in part by this "fence". Consequently, the surrounding circuit features of integrated circuit chip 20 also experience a considerably lowered temperature of operation.

As will be understood in view of the above, heat from the circuit portion 30 can still warm the substrate 30 in general, and can still reach other circuit elements on this substrate. However, the heat transfer path length from the portion 30 to the other circuit elements is effectively lengthened. That is, the direct pathway through the "fence" of plugs 50 is effectively shorted so that heat flow along this path is diverted along pathway 36. Only a longer pathway deeper within the substrate 32 is available to heat flow from circuit portion 30 to the other circuit features outside of this portion. The longer pathway understandably will result in lower heat transfer rates and in lower operating temperature at the circuit features outside of portion 30.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

We claim:

1. An integrated circuit having an integrated circuit chip housed within a package, said package providing for electrical interface of said integrated circuit chip with external electrical circuitry and also providing environmental protection for said integrated circuit chip, said integrated circuit comprising:

said circuit chip having a semiconductor substrate;

an electrical circuit portion of said integrated circuit formed on said semiconductor substrate;

a frame-like portion of a metallization layer carried by said semiconductor substrate and circumscribing said electrical circuit portion: and means forming a high-conductivity heat transfer pathway from said frame-like portion to said package;

wherein said substrate also carries an insulative layer of material overlying said semiconductor substrate, and said means forming said high-conductivity heat transfer pathway includes a via penetrating said insulative layer of material said via including electrically and thermally conductive material in contacting electrical and heat transfer relation with said metallization layer at one side of said insulative layer of material and being in contacting heat transfer relation with additional structure of said high-conductivity heat transfer pathway at an opposite side of said insulative layer.

2. An integrated circuit having an integrated circuit chip housed within a package, said package providing for electrical interface of said integrated circuit chip with external electrical circuitry and also providing environmental protection for said integrated circuit chip, said integrated circuit comprising:

said circuit chip having a semiconductor substrate;

an electrical circuit portion of said integrated circuit formed on said semiconductor substrate;

a frame-like portion of a metallization layer overlying said semiconductor substrate and circumscribing said electrical circuit portion; and means forming a high-conductivity heat transfer pathway from said frame-like portion to said package;

wherein said means forming said high-conductivity heat transfer pathway includes a via penetrating an insulative layer of material overlying said semiconductor substrate, and said via including electrically and thermally conductive material in contacting electrical and heat transfer relation with said metallization layer at one side of said insulative layer and being in contacting heat transfer relation with additional structure of said high-conductivity heat transfer pathway at an opposite side of said insulative layer;

wherein said means forming said high-conductivity heat transfer pathway further includes another metallization layer overlying said insulative layer, said thermally conductive material of said via being in contacting heat transfer relation with said another metallization layer at said opposite side of said insulative layer.

3. The integrated circuit of claim 2 wherein said means forming said high-conductivity heat transfer pathway further includes said another metallization layer being in electrical and heat transfer connection with an electrical connection feature, said electrical connection feature making electrical contact directly with said package and being also in direct contact heat transfer relation with said package.

4. The integrated circuit of claim 3 wherein said electrical connection feature includes a solder bonding bump carried by said integrated circuit chip, said solder bonding bump being bonded to an electrical connection of said package and being in direct heat transfer connection therewith.

5. An integrated circuit having an integrated circuit chip housed within a package, said package providing for electrical interface of said integrated circuit chip with external electrical circuitry and also providing environmental protection for said integrated circuit chip, said integrated circuit comprising:

said circuit chip having a semiconductor substrate;

an electrical circuit portion of said integrated circuit formed on said semiconductor substrate;

a frame-like portion of a metallization layer overlying said semiconductor substrate and circumscribing said electrical circuit portion; and means forming a high-conductivity heat transfer pathway from said frame-like portion to said package;

wherein said means forming said high-conductivity heat transfer pathway includes a first layer of insulative material overlying said semiconductor substrate and said metallization layer, said first layer of insulative material defining a first via penetrating therethrough, and said first via including electrically and thermally conductive material extending therethrough and at one side of said layer of insulative material being in contacting electrical and heat transfer relation with said frame-like portion of said metallization layer, another metallization layer overlying said first layer of insulative material, said thermally conductive material of said first via being in contacting heat transfer relation with said another metallization layer at an opposite side of said first layer of insulative material, a second layer of insulative material overlying said second metallization layer and defining a second via therethrough, said second via including respective electrically and thermally conductive material extending therethrough and at one side of said second layer of insulating material being in contacting electrical and heat transfer relation with said another metallization layer, a third metallization layer overlying said second layer of insulative material, said thermally conductive material of said second via being in contacting heat transfer relation with said third metallization layer at an opposite side of said second layer of insulative material, an electrical connection feature carried by said third metallization layer, said electrical connection feature making electrical contact directly with said package and being also in direct contact heat transfer relation with said package.

6. The integrated circuit of claim 5 wherein said first via and said second via are aligned with one another.

7. An integrated circuit having an integrated circuit chip housed within a package, said package providing for electrical interface of said integrated circuit chip with external electrical circuitry and also providing environmental protection for said integrated circuit chip, said integrated circuit comprising:

said circuit chip having a semiconductor substrate;

an electrical circuit portion of said integrated circuit formed on said semiconductor substrate;

a frame-like portion of a metallization layer overlying said semiconductor substrate and circumscribing said electrical circuit portion; and means forming a high-conductivity heat transfer pathway from said frame-like portion to said package;

wherein said semiconductor substrate further defines an elongate hole aligned with said frame-like portion of said metallization layer and extending into said semiconductor material of said substrate, an elongate metallic thermally conductive plug member received in said hole of said substrate, said metallic thermally conductive member at one end thereof being in contacting heat transfer relationship with said frame-like portion of said metallization layer.

8. An integrated circuit having an integrated circuit chip housed within a package, said package providing for electrical interface of said integrated circuit chip with external electrical circuitry and also providing environmental protection for said integrated circuit chip, said integrated circuit comprising:

said integrated circuit chip having a semiconductor substrate;

an electrical circuit portion of said integrated circuit chip being formed on said semiconductor substrate, said electrical circuit portion liberating heat into said semiconductor substrate during operation of said integrated circuit chip;

said semiconductor substrate further defining an elongate hole adjacent to said electrical circuit portion and extending into said semiconductor material of said substrate, an elongate metallic thermally conductive plug member received in said elongate hole of said substrate, a metallization layer carried by and overlying said semiconductor substrate;

said metallic thermally conductive plug member at one end thereof being in contacting heat transfer relationship with said metallization layer; and means forming a high-conductivity heat transfer pathway from said plug and metallization layer to said package.

9. The integrated circuit of claim 8 wherein said integrated circuit chip further includes a layer of insulative material overlying said metallization layer, and said means forming said high-conductivity heat transfer pathway includes said layer of insulative material defining a via penetrating therethrough; an elongate mass of electrically conductive and thermally conductive material being received in said via and being in contacting electrical and heat transfer relation with said metallization layer at one side of said insulative layer, and said electrically and thermally conductive material also being in contacting heat transfer relation with additional structure of said high-conductivity heat transfer pathway at an opposite side of said layer of insulative material.

10. An integrated circuit having an integrated circuit chip housed within a package, said package providing for electrical interface of said integrated circuit chip with external electrical circuitry and also providing environmental protection for said integrated circuit chip, said integrated circuit comprising:

said circuit chip having a semiconductor substrate;

an electrical circuit portion of said integrated circuit formed on said semiconductor substrate, said electrical circuit portion liberating heat into said semiconductor substrate during operation of said integrated circuit;

said semiconductor substrate further defines an elongate hole adjacent to said electrical circuit portion and extending into said semiconductor material of said substrate, an elongate metallic thermally conductive plug member received in said hole of said substrate;

a metallization layer overlying said semiconductor substrate;

said metallic thermally conductive plug member at one end thereof being in contacting heat transfer relationship with said metallization layer; and means forming a high-conductivity heat transfer pathway from said plug and metallization layer to said package;
wherein said means forming said high-conductivity heat transfer pathway includes a layer of insulative material overlying said metallization layer, said layer of insulative material defining a via penetrating therethrough; electrically and thermally conductive material received in said via and being in contacting electrical and heat transfer relation with said metallization layer at one side of said insulative layer, said electrically and thermally conductive material being in contacting heat transfer relation with additional structure of said high-conductivity heat transfer pathway at an opposite side of said insulative layer;
wherein said means forming said high-conductivity heat transfer pathway further includes another metallization layer overlying said layer of insulative material, said thermally conductive material of said via being in contacting heat transfer relation with said another metallization layer at said opposite side of said layer of insulative material.

11. The integrated circuit of claim 10 wherein said means forming said high-conductivity heat transfer pathway further includes said another metallization layer being in electrical and heat transfer connection with an electrical connection feature, said electrical connection feature making electrical contact directly with said package and being also in direct contact heat transfer relation with said package.

12. The integrated circuit of claim 11 wherein said electrical connection feature includes a solder bonding bump carried by said integrated circuit chip, said solder bonding bump being bonded to an electrical connection of said package and being in direct heat transfer connection therewith.

13. An integrated circuit having an integrated circuit chip housed within a package, said package providing for electrical interface of said integrated circuit chip with external electrical circuitry and also providing environmental protection for said integrated circuit chip, said integrated circuit comprising:

said circuit chip having a semiconductor substrate;

an electrical circuit portion of said integrated circuit formed on said semiconductor substrate, said electrical circuit portion liberating heat into said semiconductor substrate during operation of said integrated circuit;

said semiconductor substrate further defines an elongate hole adjacent to said electrical circuit portion and extending into said semiconductor material of said substrate, an elongate metallic thermally conductive plug member received in said hole of said substrate;

a metallization layer overlying said semiconductor substrate;

said metallic thermally conductive plug member at one end thereof being in contacting heat transfer relationship with said metallization layer; and means forming a high-conductivity heat transfer pathway from said plug and metallization layer to said package;
wherein said means forming said high-conductivity heat transfer pathway includes:

a first layer of insulative material overlying said semiconductor substrate and said metallization layer, said first layer of insulative material defining a first via penetrating therethrough;

electrically and thermally conductive material received in said first via and extending therethrough, said electrically and thermally conductive material at one side of said first layer of insulative material being in contacting electrical and heat transfer relation with said metallization layer:

another metallization layer overlying said first layer of insulative material:

said electrically and thermally conductive material in said first via being in contacting heat transfer relation with said another metallization layer at an opposite side of said first layer of insulative material;

an electrical connection feature in electrical and heat transfer connection with said another metallization layer, said electrical connection feature making electrical contact directly with said package and being also in direct contact heat transfer relation with said package.

14. The integrated circuit of claim 13 wherein said first via and said plug member are aligned with one another.

15. A method of providing high-conductivity conductive heat transfer cooling to a semiconductor integrated circuit chip having a semiconductor substrate with a circuit portion defined thereon, which circuit portion during operation of said integrated circuit chip liberates heat into said semiconductor substrate, said circuit portion including a layer of insulative material overlying said substrate, said method comprising steps of:

forming an elongate hole penetrating into said semiconductor substrate through said layer of insulative material and adjacent to said circuit portion;

providing an elongate thermally conductive plug member having a heat transfer coefficient significantly greater than said layer of insulative material, providing conductive heat transfer contact of said plug member with said semiconductor substrate, and also providing a heat transfer contact of an end of said plug member with a highly conductive heat transfer pathway leading from said end of said plug to ambient.

16. The method of claim 15 wherein said step of providing heat transfer contact of an end of said plug member with a highly conductive heat transfer pathway leading from said end of said plug to ambient included steps of:

forming a metallization layer overlying said semiconductor substrate and said layer of insulative material;

providing contact of said thermally conductive plug member at said end thereof with said metallization layer; and forming a high-conductivity heat transfer pathway from said plug and metallization layer to a package for said integrated circuit chip.

17. The method of claim 16 wherein said step of providing a highly-conductive heat transfer pathway from said plug and metallization layer to said package includes steps of:

forming an additional layer of insulative material overlying said metallization layer, defining in said additional layer of insulative material a via penetrating therethrough;

depositing electrically and thermally conductive material in said via in contacting electrical and heat transfer relation with said metallization layer at one side of said additional layer of insulative layer; and placing said electrically and thermally conductive material in contacting heat transfer relation with additional structure forming said high-conductivity heat transfer pathway at an opposite side of said additional layer of insulative material.

18. The method of claim 17 wherein said step of placing said electrically and thermally conductive material in contacting heat transfer relation with additional structure forming said high-conductivity heat transfer pathway at an opposite side of said additional layer of insulative material includes steps of:

provide a solder bonding bump carried by said integrated circuit chip;

bonding said solder bonding bump to an electrical connection of said package and in direct heat transfer connection therewith.

19. The method of claim 17 further including the step of placing said via and said electrically and thermally conductive material therein in alignment with said plug member.

20. The method of claim 15 further including the step of forming plural elongate holes in an array circumscribing said circuit portion, extending said plural elongate holes through said layer of insulative material and into said semiconductor substrate; providing plural elongate thermally conductive plug members one in each one of said plural elongate holes and having a heat transfer coefficient significantly greater than said layer of insulative material and in heat transfer relation with said substrate to receive heat therefrom; placing each of said plural elongate plug members in heat transfer contact with said highly heat conductive heat transfer pathway leading to ambient, thereby to circumscribe said circuit portion with an array of heat transfer "stakes" penetrating into said semiconductor substrate to transfer heat from said circuit portion during operation thereof.

* * * * *